(12) United States Patent
Masciantonio et al.

(10) Patent No.: US 11,355,691 B2
(45) Date of Patent: Jun. 7, 2022

(54) PIEZOELECTRIC ACTUATOR TYPE CONTROL DEVICE FOR CAPACITIVE LOADS

(71) Applicants: Centre Technique des Industries Mécaniques, Senlis (FR); Ecole Nationale Supérieure des Arts et Métiers (ENSAM), Paris (FR); AMVALOR, Paris (FR)

(72) Inventors: Ugo Masciantonio, Proville (FR); George Moraru, Aix-en-Provence (FR); Théophile Durdan, Paris (FR)

(73) Assignees: CENTRE TECHNIQUE DES INDUSTRIES MECANIQUES; ECOLE NATIONALE SUPERIEURE DES ARTS ET METIERS (ENSAM); AMVALOR

( * ) Notice: Subject to any disclaimer, the term of this patent is extended or adjusted under 35 U.S.C. 154(b) by 332 days.

(21) Appl. No.: 16/470,363

(22) PCT Filed: Dec. 13, 2017

(86) PCT No.: PCT/FR2017/053554
§ 371 (c)(1),
(2) Date: Jun. 17, 2019

(87) PCT Pub. No.: WO2018/109387
PCT Pub. Date: Jun. 21, 2018

(65) Prior Publication Data
US 2020/0091399 A1    Mar. 19, 2020

(30) Foreign Application Priority Data

Dec. 15, 2016 (FR) .................................. 1662550

(51) Int. Cl.
H01L 41/04 (2006.01)
H02N 2/08 (2006.01)
(Continued)

(52) U.S. Cl.
CPC ........ *H01L 41/042* (2013.01); *H02M 7/5387* (2013.01); *H02M 11/00* (2013.01); *H02N 2/065* (2013.01)

(58) Field of Classification Search
CPC ............................. H01L 41/042; H02N 2/065
(Continued)

(56) References Cited

U.S. PATENT DOCUMENTS

2001/0035697 A1* 11/2001 Rueger .................. H02N 2/067
310/316.03
2014/0117882 A1   5/2014 Viele ................................ 318/4

FOREIGN PATENT DOCUMENTS

EP   1 235 283 A2   8/2002

OTHER PUBLICATIONS

International Search Report dated Mar. 21, 2018 in corresponding PCT International Application No. PCT/FR2017/053554.
(Continued)

Primary Examiner — Derek J Rosenau
(74) Attorney, Agent, or Firm — Ostrolenk Faber LLP

(57) ABSTRACT

A piezoelectric actuator control device comprising a first voltage converter supplying a DC voltage on a DC power supply bus to which is connected a second voltage converter capable of generating a variable excitation voltage under the control of a control computer, the second voltage converter comprising two switch half-bridges mounted in parallel with the terminals of a bus capacitor, the control computer being suitable for controlling the two switch half-bridges according to a first control configuration, in which they are controlled independently in order to each supply a voltage in
(Continued)

a range between zero and a maximum positive value and according to a second control configuration, in which they are jointly controlled as a full-bridge for supplying a voltage between a minimum negative value and said maximum positive value.

7 Claims, 1 Drawing Sheet

(51) Int. Cl.
      *H02M 7/5387*    (2007.01)
      *H02M 11/00*     (2006.01)
      *H02N 2/06*      (2006.01)

(58) Field of Classification Search
      USPC .......................................................... 310/317
      See application file for complete search history.

(56) References Cited

OTHER PUBLICATIONS

Written Opinion dated Mar. 21, 2018 in corresponding PCT International Application No. PCT/FR2017/053554.

\* cited by examiner

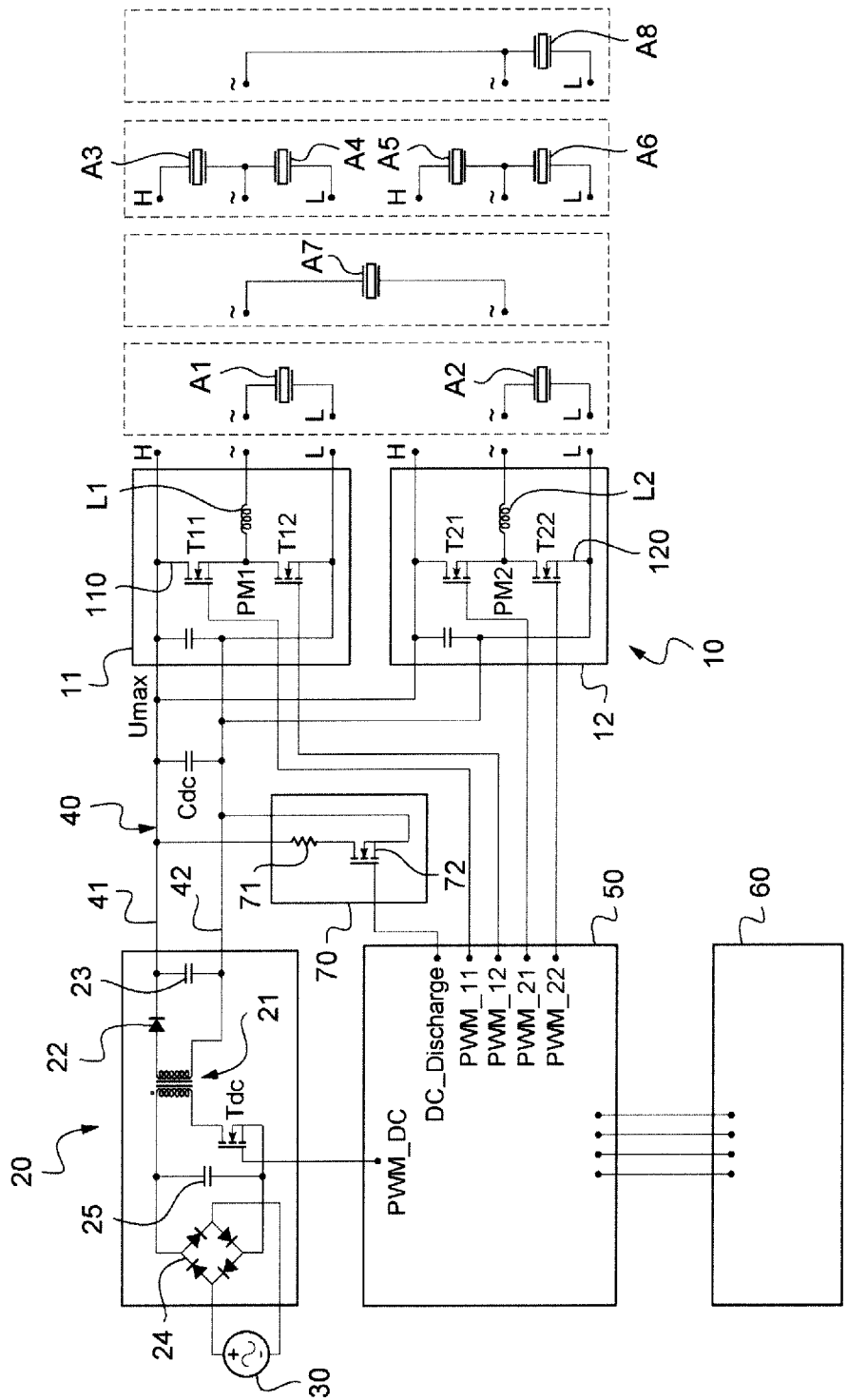

PIEZOELECTRIC ACTUATOR TYPE CONTROL DEVICE FOR CAPACITIVE LOADS

CROSS-REFERENCE TO RELATED APPLICATIONS

The present application is a 35 U.S.C. §§ 371 national phase conversion of PCT/FR2017/053554, filed Dec. 13, 2017, which claims priority to French Patent Application No. 1662550, filed Dec. 15, 2016, the contents of which are incorporated herein by reference. The PCT International Application was published in the French language.

TECHNICAL FIELD

The present invention relates to a device for controlling at least one piezoelectric actuator driven electronically using a control computer.

BACKGROUND OF THE INVENTION

A certain number of applications requiring actuation means based on piezoelectric actuators are known.

For example, in control applications, active movements of piezoelectric actuators, placed in judiciously chosen locations, may be controlled so as to counteract the effect of external interference, thus decreasing the amplitude of vibrations, of noise, etc.

In other types of applications, for example in the field of vibration drilling, these actuators may be used, conversely, to generate a vibration exhibiting specific characteristics in terms of amplitude, frequency, and shape.

The advantages of piezoelectric actuators lie in their extreme stiffness, their intrinsic precision and their very high power-to-weight ratio with respect to other actuation principles.

However, the nonlinear effects which characterize their operation hold back their use and their development. The supply of power to and the control of these actuations give rise to problems related to the capacitive nature of their impedance. Their limited travel may also prove to be problematic, as is their fragility when they are subjected to anything other than compressive strain.

Thus, to avoid faults, a piezoelectric actuator must be preloaded with a force that has to exceed the maximum tensile force to which it might be subjected (inertial force included). In this way, tensile strain is avoided. An elastic prestressing device, including a spring for prestressing the piezoelectric actuator, is generally used. The optimal prestresses that have to be ensured, provided by manufacturers, require springs that are capable of producing very large forces. At the same time, it is important for these springs to exhibit the lowest possible stiffnesses, so as to avoid amplitude losses. These two constraints, in combination with a requirement for compactness, are antagonistic by their nature, frequently resulting in performance limitations, increased bulk and/or high costs.

To overcome these drawbacks, one known solution consists in implementing two identical actuators connected face-to-face and in making them work in opposition, after applying a preload via stiff means. In other words, a second actuator, shaped and arranged to generate forces that are opposite in terms of direction and phase to the vibration-generating forces of the first actuator, is used. Stated otherwise, this counterforce is generated by a second actuator which is identical to the first and which is arranged both facing it and in opposition thereto. This type of assembly has the advantage of a stiffness that is independent of the preloading springs, along with almost zero amplitude loss, the force experienced by each actuator being almost invariable.

The drawback of this type of assembly lies in the fact that with the current full-bridge inverters, it is necessary to use a dedicated power electronics system per actuator, which increases the costs considerably. A simpler and less expensive solution consists in driving the assembly of two face-to-face actuators using a single half-bridge inverter. This driver mode nonetheless requires numerous precautions in order to avoid faults of an electrical nature when connecting the actuators or when starting up an actuation system that has already been coupled. Specifically, the use of this assembly assumes that one of the actuators is connected between a supply line of the inverter at the low potential, for example 0 V, and the output of the inverter arm (midpoint), and that the other actuator is connected between the output of the inverter arm and a supply line of the inverter at the high potential, with a value Umax. The arm of the inverter may thus oscillate about the level Umax/2, with an amplitude of Umax/2. One of the main problems is due to the fact that when voltage is applied to the system, if precautions are not taken beforehand, the actuator connected to the line at the high potential with a value Umax may be subjected to wildly varying voltages, depending on the DC voltage source (DC supply stage), which may result in faults.

The necessity of these precautions is further highlighted by another issue of note for these actuators, related to the relative tensile mechanical fragility. Specifically, since these actuators conventionally consist of a stack of thin layers of piezoelectric ceramics which bend under the effect of an electric field, it is necessary to avoid overly sudden variations in the supply voltage, since the resulting shockwaves propagate through the layers of the actuator and weaken its structure.

It is therefore necessary to be able to limit the variation in the supply voltage at the terminals of the actuators to a certain degree when the actuators are driven in a face-to-face assembly.

Furthermore, the power electronics for controlling the actuators are generally designed to generate, from a DC voltage source, a periodic voltage, over a voltage excursion range 0-Umax (with Umax varying from around 150-200 V for "low-voltage" actuators to around 1000 V for "high-voltage" actuators), at high frequency, which may reach around ten kilohertz (depending on the actuator and its environment), in order to excite the piezoelectric cells. However, certain piezoelectric ceramic technologies are known for the production of actuators which may be used with negative excitation voltages, corresponding for example to around −20% of the voltage Umax, which provides an increase in the available amplitude by around 20%. However, inverters based on the half-bridge topology, which are broadly preferred because of their simplicity in terms of production and implementation, do not allow, with single-level DC voltage stages, negative voltages to be generated. In other words, half-bridge inverters do not allow the possibility of exciting these actuators using negative voltages to be exploited. Thus, currently, out of the existing power electronics, a full-bridge inverter topology is needed to be able to drive an actuator over its entire excursion range, from a negative voltage to a positive voltage, for example from −20% Umax to 100% Umax.

The result of the above is that certain operating modes dictate the use of a half-bridge inverter topology for controlling the actuators, which is the case in particular for controlling a face-to-face assembly of two identical actuators, whereas other operating modes may require the use of a full-bridge topology, which is the case in particular when it is advantageous to make use of the possibility of exciting the actuators using negative voltages. Thus, it appears to be difficult to provide a common power electronics system that is capable of adjusting to the various operating modes mentioned.

SUMMARY OF THE INVENTION

An object of the invention is to overcome this limitation.

According to the invention, this object is achieved by a device for controlling at least one piezoelectric actuator driven electronically using a control computer, including a first stage for generating a DC voltage including a first voltage converter circuit for delivering said DC voltage over a DC supply bus provided with a first supply line and with a second supply line, to each of which an electrical potential is applied with a view to obtaining a voltage on the DC supply bus, and a second, switched-mode power supply stage, connected to said DC supply bus, including a second voltage converter circuit supplied with said DC voltage so as to generate at least one variable excitation voltage for said at least one piezoelectric actuator under the control of said control computer, said device being characterized in that said second voltage converter circuit includes two half-bridges of switches connected in parallel to the terminals of a bus capacitor which is connected to the first supply line and to the second supply line of said DC supply bus, said control computer being suitable for controlling each of the half-bridges of switches both independently, in a first control configuration in which the two half-bridges of switches are controlled individually so as to deliver a respective excitation voltage varying between zero and a positive maximum value to at least one piezoelectric actuator that is capable of being connected at the output of each half-bridge of switches, respectively, and jointly, in a second control configuration in which the two half-bridges of switches are controlled together as a full bridge so as to deliver an excitation voltage varying between a negative minimum value and said positive maximum value to a piezoelectric actuator that is capable of being connected between the respective midpoints of the two half-bridges of switches.

In a first embodiment, said control computer is suitable for controlling, in said first control configuration, a pair of piezoelectric actuators connected in a face-to-face assembly at the output of each independently controlled half-bridge of switches, each piezoelectric actuator of a pair being connected between the midpoint of said corresponding bridge of switches and the first supply line of said DC supply bus and the midpoint of said corresponding bridge of switches and the second supply line of said DC supply bus, respectively.

In a second embodiment, said control computer is suitable for controlling, in said first control configuration, a single piezoelectric actuator connected at the output of each independently controlled half-bridge of switches, said piezoelectric actuator being connected between the midpoint of said corresponding bridge of switches and the second supply line of said DC supply bus.

Advantageously, in the first embodiment, said first voltage converter circuit is suitable for being controlled by a control signal transmitted by the control computer so as to ensure that the slope of the rise in the voltage on said DC supply bus between zero and said positive maximum value is limited when voltage is applied to the actuators to be driven.

In another embodiment, said control computer is suitable for controlling the two half-bridges of switches in a third control configuration in which an actuator is connected between both the output of one of the two half-bridges of switches, which is connected to the first or to the second supply line of said DC supply bus, and the two midpoints, which are connected together, of the two half-bridges of switches.

Advantageously, a discharge resistor for discharging said bus capacitor is connected in parallel to said bus capacitor between said first and second supply lines of the DC supply bus, and a controllable switch is connected in series with said discharge resistor between said first and second supply lines of the DC supply bus, said switch being suitable for being controlled by said control computer so as to return the voltage on the DC supply bus to zero after the use of the one or more actuators.

Advantageously, an inductor is connected at the output of the respective midpoints of the two half-bridges of switches, said inductor being sized so as to constitute, together with the capacitances of the one or more controlled actuators, a filter, the cut-off frequency of which will be lower than a resonant frequency to be avoided.

BRIEF DESCRIPTION OF THE DRAWING

Other particularities and advantages of the invention will become apparent upon reading the description, provided below, of one particular embodiment of the invention, given by way of nonlimiting indication, with reference to the sole FIGURE illustrating the control device according to the invention.

DESCRIPTION OF PREFERRED EMBODIMENTS

According to the diagram in the sole FIGURE, the control device of the invention comprises a DC-to-AC voltage converter circuit 10 suitable for driving one or more actuators according to various possible operating modes, which will be described in detail below. The DC-to-AC converter circuit 10 is designed to generate a periodic high voltage, which may reach many hundreds of volts, for example equal to 1000 V, at high frequency, which may reach, for example, several tens of kHz, in order to excite the one or more piezoelectric actuators, from a DC voltage source, in this instance an AC-to-DC voltage converter circuit 20. This converter circuit 20 is for example a flyback converter, which is one of the possible topologies for carrying out this function. It comprises a transformer 21 and a chopping transistor Tdc in series with the primary winding of the transformer 21, while a diode 22 and an output capacitor 23 are arranged at the output of the secondary winding of the transformer 21. The transformer 21 is supplied with power by a diode bridge 24, connected to an external AC power supply network 30. The output of the diode bridge is connected to a capacitor 25 which is connected to the terminals of the primary winding of the transformer 21 upstream of the chopping transistor Tdc.

Thus, from the rectified voltage delivered by the diode bridge 24, the flyback converter circuit 20 supplies a downstream DC power supply bus 40 provided with a first supply line 41 and with a second supply line 42, to each of which an electrical potential, namely a high electrical potential H, with a value Umax, and a low electrical potential L, is applied. A bus capacitor Cdc is connected between the supply line 41 at the high potential H and the supply line 42 at the potential L of the DC supply bus, upstream of the DC-to-AC converter circuit 10 supplied by the DC supply bus 40.

The DC-to-AC converter circuit 10 consists of two pulsewidth-modulated (PWM) half-bridge inverter circuits (or half-bridges of switches) 11 and 12, respectively, which are connected in parallel to the terminals of the bus capacitor Cdc over the DC supply bus 40 and which are intended to deliver, independently or together, an excitation voltage to the terminals of one or more piezoelectric actuators connected at the output to the converter circuit 10 on the basis of a control setpoint.

This control setpoint comes from the control computer of the control device. This control computer 50 is in particular responsible for managing the control for driving the one or more piezoelectric actuators connected at the output to the converter circuit 10, as well as the control of the AC-to-DC converter circuit 20, and is based on a microcontroller, a microprocessor, a DSP (digital signal processor) or the like.

The first inverter circuit 11 consists of a half-bridge of switches. It comprises a switching arm 110 connected between the first supply line 41 and the second supply line 42 of the DC supply bus 40 and includes two controlled switches T11, T12 (for example MOSFETs), which are connected in series via what is called the midpoint PM1 of the switching arm 110. The control computer 50 is suitable for generating PWM control output signals PWM_11 and PWM_12, which are applied to the gate of the first switch T11 and to the gate of the first switch T12, respectively. These switches are controlled such that when one of them is closed, the other is open, and vice versa.

In the same way, the second inverter circuit 12 consists of a half-bridge of switches. It comprises a switching arm 120 connected between the first supply line 41 and the second supply line 42 of the DC supply bus 40 and includes two controlled switches T21, T22 (for example MOSFETs), which are connected in series via what is called the midpoint PM2 of the switching arm 120. The control computer 50 is suitable for generating PWM control output signals PWM_21 and PWM_22, which are applied to the gate of the first switch T21 and to the gate of the first switch T22, respectively. These switches are controlled such that when one of them is closed, the other is open, and vice versa.

Furthermore, an inductor L1, L2 is connected at the output to the midpoint of each half-bridge inverter circuit 11, 12, so as to remove the risk of resonance with the devices containing the piezoelectric actuators connected at the output to the inverter circuits 11 and 12, and/or the shocks which may be generated. Thus, the inductor at the output of each two half-bridge inverter circuit 11, 12 is sized so as to constitute, together with the capacitances of the controlled actuators, a filter, the cut-off frequency of which is lower than the resonant frequency to be avoided. The values of the inductances may thus be matched to the desired application. Other types of circuits that are able to perform this filter role could be used.

As will now be described in greater detail, the simultaneous driving, by the control computer 50, of both the DC-to-AC converter circuit 10 and of the two half-bridge inverter circuits 11 and 12 of the DC-to-AC converter circuit 10 will make it possible, in a first control configuration in which the two half-bridge inverter circuits are driven individually, to control a single actuator or a pair of actuators in a face-to-face assembly per half-bridge inverter circuit 11 and 12, operated over a range of voltages from 0 to 100% of $U_{max}$, and, in a second control configuration in which the two half-bridge inverter circuits are driven together so as to switch to full-bridge topology, to control an actuator operated over a range of voltages ranging from −20% to 100% of $U_{max}$.

Thus, a first case of use of the first control configuration relates to the case in which a single piezoelectric actuator is connected at the output of each half-bridge inverter circuit 11, 12 controlled independently by the control computer 50. Thus, as illustrated in the sole FIGURE, a piezoelectric actuator A1 is connected at the output of the first half-bridge inverter circuit 11 and a piezoelectric actuator A2 is connected at the output of the second half-bridge inverter circuit 12. More specifically, the piezoelectric actuator A1 is connected between the midpoint PM1 of the half-bridge inverter circuit 11, downstream of the inductor L1, and the second supply line 42 at the potential L of the DC supply bus 40, and the piezoelectric actuator A2 is connected between the midpoint PM2 of the half-bridge inverter circuit 12, downstream of the inductor L2, and the second supply line 42 at the potential L of the DC supply bus 40.

Since the two half-bridge inverter circuits 11, 12 are driven independently by the control computer 50 via the control output signals PWM_11 and PWM_12 and the control output signals PWM_21 and PWM_22, respectively, each of the two piezoelectric actuators A1 and A2 may be controlled over its entire voltage excursion range from zero to 100% of $U_{max}$, i.e. 1000 V according to the example. Given that these control signals result from the logic implemented in the computer 50, it is thus possible to avoid any overly large variation in the voltage applied to the terminals of the actuators.

A second case of use of the first control configuration relates to the case in which a pair of piezoelectric actuators is connected in a face-to-face assembly at the output of each half-bridge inverter circuit 11, 12 controlled independently by the control computer 50. Thus, as illustrated in the sole FIGURE, a first pair of piezoelectric actuators A3/A4 is connected in a face-to-face assembly at the output of the first half-bridge inverter circuit 11 and a second pair of piezoelectric actuators A5/A6 is connected in a face-to-face assembly at the output of the second half-bridge inverter circuit 12. More specifically, for each pair of actuators in a face-to-face assembly that is connected to the output of one of the two half-bridge inverter circuits, one of the actuators of the pair is connected between the midpoint of the half-bridge inverter circuit and the first supply line 41 at the potential H of the DC supply bus 40 and the other actuator of the pair is connected between the midpoint of the half-bridge inverter circuit and the second supply line 42 at the potential L of the DC supply bus 14. The actuators of each pair of actuators may thus be controlled over a range of voltages from zero to 1000 V by virtue of the fact that the two half-bridge inverter circuits 11, 12 may be driven independently. For this particular case of use, the actuators may be protected from abrupt variations in voltage (when starting up the system, or when connecting the actuators), by making use of the possibility for the computer 50 to control the output voltage of the AC-to-DC converter circuit 20 using the control signal PWM_DC, as will be described below.

Furthermore, the two half-bridge inverter circuit 11 and 12, may also be driven jointly by the control computer 50 in a second control configuration so as to switch the converter circuit 10 to "full-bridge" topology, allowing negative voltages to be generated. Thus, a case of use of this second control configuration relates to the case in which a piezoelectric actuator which may be controlled using negative voltages, for example of the order of 20% of $U_{max}$, i.e. −200

V in this example, thus allowing a gain in amplitude, is connected at the output of the converter 10. Thus, as illustrated in the sole FIGURE, such a piezoelectric actuator A7 is connected between the respective midpoints PM1 and PM2 of the two half-bridge inverter circuits 11 and 12, which are controlled in coordination by the control computer so as to switch the converter circuit 10 to "full-bridge" topology for an operating mode ranging from −20% of $U_{max}$ to 100% of $U_{max}$, i.e. from −200 V to 1000 V in this example.

Another control configuration of the proposed topology, which will be described below, is more particularly suited to driving piezoelectric actuators for which the necessary power exceeds that of a single half-bridge inverter circuit, presented above. This other control configuration consists in connecting the two half-bridge inverter circuits 11 and 12 in parallel in order to increase the total power delivered to a high-capacity actuator connected at the output. In this configuration, the actuator in question may be connected between the output connected to one of the two supply lines at the high or low potential of one of the two inverter circuits and the two midpoints, which are connected together, of the two half-bridge inverter circuits. Thus, according to the example of the sole FIGURE, a piezoelectric actuator A8 is connected between the output of the half-bridge inverter circuit 12 which is connected to the potential L of the DC supply bus and the two midpoints PM1 and PM2, which are connected together, of the two half-bridge inverter circuits 11 and 12, downstream of the inductors L1 and L2, respectively. This configuration makes it possible to double the intensity of the maximum current and may also have a beneficial effect on the residual voltages at the terminals of the output actuator. This other control configuration could also be applied to the control of a pair of piezoelectric actuators connected at the output in a face-to-face assembly.

A user interface 60 cooperates with the control computer 50 so as to allow a driver mode to be selected by the control computer 50 according to either of the first and second control configurations, thus making it possible to adjust to the various cases of use mentioned.

Furthermore, in the case of use with two pairs of actuators working in a face-to-face assembly connected at the output of each half-bridge inverter circuit 11 and 12, respectively, controlled independently in the first control configuration, it is necessary, as explained above, to limit the variation in the supply voltage at the terminals of the actuators to a certain degree, in particular when starting up the system, when it is in operation and when it is shut down. Thus, the control computer 50 is suitable for controlling the AC-to-DC converter circuit 20 so as to ensure that the slope of the rise in the voltage on the DC supply bus 40 up to $U_{max}$ is limited when voltage is applied to the actuators connected at the output to the converter circuit 10. To ensure that this slope of the rise in the voltage is limited, the control computer 50 is suitable for delivering a PWM control signal PWM_DC with a variable duty cycle for driving the chopping transistor Tdc that is connected is series with the primary winding of the transformer 21 of the AC-to-DC converter circuit 20. More specifically, the control computer 50 is suitable for gradually increasing the variable duty cycle of the control signal PWM_DC for the chopping transistor Tdc until the positive maximum value $U_{max}$ is reached on the DC supply bus 40 along said limited slope, and for holding this variable duty cycle at a stationary value once the value $U_{max}$ is reached on the DC supply bus.

As illustrated in the sole FIGURE, the bus capacitor Cdc is associated with a driven discharge circuit 70. The bus capacitor ensures that the currents drawn by the inverter circuits 11 and 12 of the voltage converter circuit from the AC-to-DC converter circuit 20 are sufficiently smoothed and decreased.

Meanwhile, the discharge circuit 70 for the bus capacitor Cdc makes it possible to manage, in a controlled manner, the voltage drop on the bus when the piezoelectric actuators are shut down after use, thereby allowing it to be made safe quickly on shutdown. The discharge circuit 70 comprises a discharge resistor 71 connected in parallel with the bus capacitor Cdc on the DC supply bus, upstream of the bus capacitor Cdc. A switch 72 is connected in series with the discharge resistor 71 between the supply lines of the DC supply bus. The discharge circuit 70 may be controlled by the control computer so as to switch between two states via a control signal "DC-Discharge" for the switch 72 generated by the control computer, which is suitable for controlling a switch to a first state in which the bus capacitor Cdc charging current flows through the discharge resistor 71 that is connected in parallel with the DC supply bus, and to a second state in which the discharge resistor 71 is shorted and the discharge circuit is disconnected from the DC supply bus. Advantageously, the discharge resistor 71 is connected to the DC supply bus when the switch 72 is driven to close by the control computer 50, at the same time as a phase of shutting down the actuators that are connected at the output to the voltage converter circuit 10. Thus, this discharge resistor 71 makes it possible to discharge the bus capacitor Cdc in a controlled manner when shutting down the voltage converter circuit 10.

The invention claimed is:

1. A device for controlling at least one piezoelectric actuator driven electronically using a control computer, comprising a first stage for generating a DC voltage including a first voltage converter circuit for delivering said DC voltage over a DC supply bus provided with a first supply line and with a second supply line, to each of which an electrical potential is applied with a view to obtaining a voltage on the DC supply bus, and a second, switched-mode power supply stage, connected to said DC supply bus, including a second voltage converter circuit supplied with said DC voltage so as to generate at least one variable excitation voltage for said at least one piezoelectric actuator under the control of said control computer, said device being characterized in that said second voltage converter circuit includes two half-bridges of switches connected in parallel to the terminals of a bus capacitor which is connected to the first supply line and to the second supply line of said DC supply bus, said control computer being suitable for controlling each of the half-bridges of switches both independently, in a first control configuration in which the two half-bridges of switches are controlled individually so that each one of the two half-bridges of switches can independently operate said at least one piezoelectric actuator by delivering a respective excitation voltage varying between zero and a positive maximum value to said at least one piezoelectric actuator that is capable of being connected at the output of each half-bridge of switches, respectively, and jointly, in a second control configuration in which the two half-bridges of switches are controlled together as a full bridge so as to deliver an excitation voltage varying between a negative minimum value and said positive maximum value to said at least one piezoelectric actuator that is capable of being connected between the respective midpoints of the two half-bridges of switches.

2. The device as claimed in claim 1, wherein said control computer is suitable for controlling, in said first control configuration, at least another piezoelectric actuator, the at least one and the at least another piezoelectric actuators being connected in a face-to-face assembly at the output of each independently controlled half-bridge of switches, each piezoelectric actuator being connected between the midpoint of said corresponding bridge of switches and the first supply line of said DC supply bus and the midpoint of said corresponding bridge of switches and the second supply line of said DC supply bus, respectively.

3. The device as claimed in claim 1, wherein said control computer is suitable for controlling, in said first control configuration, a single piezoelectric actuator connected at the output of each independently controlled half-bridge of switches between the midpoint of said corresponding bridge of switches and the second supply line of said DC supply bus.

4. The device as claimed in claim 2, wherein said first voltage converter circuit is suitable for being controlled by a control signal transmitted by the control computer so as to ensure that the slope of the rise in the voltage on said DC supply bus between zero and said positive maximum value is limited when voltage is applied to the piezoelectric actuators to be driven.

5. The device as claimed in claim 1, wherein said control computer is suitable for controlling the two half-bridges of switches in a third control configuration in which the at least one piezoelectric actuator is connected between both the output of one of the two half-bridges of switches, which is connected to the first or to the second supply line of said DC supply bus, and the two midpoints, which are connected together, of the two half-bridges of switches.

6. The device as claimed in claim 1, further comprising a discharge resistor for discharging said bus capacitor, which discharge resistor is connected in parallel to said bus capacitor between said first and second supply lines of the DC supply bus, and a controllable switch that is connected in series with said discharge resistor between said first and second supply lines of the DC supply bus, said switch being suitable for being controlled by said control computer so as to return the voltage on the DC supply bus to zero after the use of the at least one piezoelectric actuator.

7. The device as claimed in claim 1, further comprising an inductor that is connected at the output of the respective midpoints of the two half-bridges of switches, said inductor being sized so as to constitute, together with the capacitances of the at least one piezoelectric actuator, a filter, the cut-off frequency of which will be lower than a resonant frequency to be avoided.

* * * * *